United States Patent
Kumagai (10) Patent No.: US 9,698,449 B2
(45) Date of Patent: Jul. 4, 2017

(54) STORAGE SYSTEM AND OUTPUT CONTROLLER

(75) Inventor: Eiji Kumagai, Kanagawa (JP)

(73) Assignee: Sony Corporation, Tokyo (JP)

( * ) Notice: Subject to any disclaimer, the term of this patent is extended or adjusted under 35 U.S.C. 154(b) by 542 days.

(21) Appl. No.: 13/879,780

(22) PCT Filed: Oct. 12, 2011

(86) PCT No.: PCT/JP2011/073975
§ 371 (c)(1),
(2), (4) Date: Apr. 16, 2013

(87) PCT Pub. No.: WO2012/053528
PCT Pub. Date: Apr. 26, 2012

(65) Prior Publication Data
US 2013/0202930 A1    Aug. 8, 2013

(30) Foreign Application Priority Data

Oct. 22, 2010   (JP) ................................ 2010-237013

(51) Int. Cl.
*H01M 10/42*     (2006.01)
*H01M 10/48*     (2006.01)
(Continued)

(52) U.S. Cl.
CPC ..... *H01M 10/4207* (2013.01); *B60L 11/1855* (2013.01); *H01M 10/0525* (2013.01);
(Continued)

(58) Field of Classification Search
CPC ......... H01M 10/0525; H01M 10/4207; H01M 10/482; H02J 7/0021; H02J 7/0024;
(Continued)

(56) References Cited

U.S. PATENT DOCUMENTS 6,462,510 B1 * 10/2002 Takada ................ B60L 11/1848
                                                                320/116
7,183,748 B1    2/2007 Unno et al.
(Continued)

FOREIGN PATENT DOCUMENTS

GB            2453207       4/2009
JP            07-231572     8/1995
(Continued)

OTHER PUBLICATIONS

Japanese Office Action issued Aug. 19, 2014, for corresponding Japanese Appln. No. 2010-237013.
(Continued)

*Primary Examiner* — Kenneth Douyette
(74) *Attorney, Agent, or Firm* — Chip Law Group (57) ABSTRACT

A connection mode of a plurality of arbitrarily connected storage units is detected and the plurality of storage units is controlled according to the detected connection mode.
Six storage modules MOD1 to MOD6 are connected in series. A total voltage V(Total) and individual output voltages V(1) to V(6) of respective storage modules are supplied to an output controller ICNT. A controller PR of the output controller ICNT determines the connection mode depending on whether a determination equation is satisfied. When the number of storage modules is set to N, the total output voltage is set to V(Total), the individual output voltages are set to V(1), V(2), . . . , and V(N), and the number of parallels of the connection mode is set to M, (determination equation: V(1)=V(2)= . . . =V(N)=(1/M)×V(Total)) is used. When the determination equation is satisfied, (N/M) parallel M series is determined.

14 Claims, 10 Drawing Sheets

(51) Int. Cl.
  *B60L 11/18* (2006.01)
  *H02J 7/00* (2006.01)
  *H01M 10/0525* (2010.01)
  *G01R 31/36* (2006.01)

(52) U.S. Cl.
  CPC ......... *H01M 10/482* (2013.01); *H02J 7/0021* (2013.01); *H02J 7/0024* (2013.01); *H02J 7/0031* (2013.01); *G01R 31/3658* (2013.01); *H01M 2220/20* (2013.01); *H02J 7/0014* (2013.01); *Y02E 60/122* (2013.01); *Y02T 10/7005* (2013.01); *Y02T 10/705* (2013.01); *Y02T 10/7011* (2013.01)

(58) Field of Classification Search
  CPC ... H02J 7/0031; H02J 7/0014; B60L 11/1851; B60L 11/1855; G01R 31/3658
  See application file for complete search history.

(56) References Cited

U.S. PATENT DOCUMENTS

| | | | | |
|---|---|---|---|---|
| 2006/0012336 | A1* | 1/2006 | Fujita | H02J 7/0021 320/119 |
| 2006/0233004 | A1 | 10/2006 | Furukawa et al. | |
| 2007/0080662 | A1 | 4/2007 | Wu | |
| 2007/0126399 | A1* | 6/2007 | Benckenstein, Jr. | H02J 7/0016 320/119 |
| 2008/0238370 | A1* | 10/2008 | Carrier | H01M 2/1022 320/134 |
| 2008/0309317 | A1* | 12/2008 | Chen | G01R 19/0084 324/72 |
| 2011/0300415 | A1 | 12/2011 | Kumagai et al. | |

FOREIGN PATENT DOCUMENTS

| | | |
|---|---|---|
| JP | 2006-280171 | 10/2006 |
| JP | 2008-118790 | 5/2008 |
| JP | 2009-100644 | 5/2009 |
| JP | 2009-512144 | 11/2009 |
| JP | 2009-289429 | 12/2009 |
| WO | 01/59905 | 8/2001 |
| WO | 2007/041828 | 4/2007 |

OTHER PUBLICATIONS

Chinese Office Action issued Sep. 11, 2014, for corresponding Chinese Appln. No. 201180049745.1.

* cited by examiner

STORAGE SYSTEM AND OUTPUT CONTROLLER

CROSS REFERENCES TO RELATED APPLICATIONS

The present application is a national stage of International Application No. PCT/JP2011/073975 filed on Oct. 12, 2011 and claims priority to Japanese Patent Application No. 2010-237013 filed on Oct. 22, 2010, the disclosure of which is incorporated herein by reference.

BACKGROUND

Disclosure of the present application relates to a storage system and an output controller.

BACKGROUND ART

Recently, application of a secondary battery such as a lithium-ion battery to be used as a vehicle storage battery and an electric power storage device in which the secondary battery is combined with a new energy system such as a photovoltaic cell and wind-power generation has been rapidly expanded. In a case where a great number of storage devices such as battery cells are used for generating significant power, a configuration in which a plurality of storage modules is connected in series is adopted. Such configuration is referred to as a battery system. In the storage module, a plurality of, for example, four unit cells (electric cells, also referred to as cells; simply appropriately referred to as cells in the following description) are connected in parallel and/or in series to configure a battery block. A great number of battery blocks are stored in an exterior case and the storage module (also referred to as an assembled battery) is configured.

For example, Patent Document 1 discloses a configuration to form a plurality of battery storage spaces by sectioning a battery storage box as the exterior case by a divider plate to store the battery block in each battery storage space.

Further, following Patent Document 2 discloses a configuration to connect a plurality of storage modules to each other and provide a control device common to a plurality of storage modules. Patent Document 2 discloses the configuration in which each storage module includes processing means (microprocessor MPU) and communicates between the MPU and the control device through the communication means.

Further, Patent Document 3 discloses a power supply device, which detects a voltage at a reference point of each of a plurality of unit cells included in one storage module by means of a multiplexer and a voltage detecting unit, supplies a detected result to a control circuit through an A/D converter, and detects disconnection of a reference connecting line connected to the reference point.

CITATION LIST

Patent Documents

Patent Document 1: Japanese Patent Application Laid-Open No. 2009-100644
Patent Document 2: Japanese Patent Application Laid-Open No. 2009-289429
Patent Document 3: Japanese Patent Application Laid-Open No. 2006-280171

SUMMARY

Problems to be Solved by the Invention

When a plurality of storage modules is used, the control device common to the plurality of storage modules is provided. Configuration of the storage system using a plurality of storage modules has an advantage that the number of the storage modules and a connection mode of the storage modules (series connection, parallel connection, or series/parallel connection) may be made appropriate according to application and the like of the storage system. However, the control device, which performs control according to the connection mode of a plurality of storage modules, is required. It is useless to prepare the control device for each connection mode, so that it is desired to change control contents (program) of the control device according to the connection mode. However, in the conventional storage device, it is not supposed that the connection mode of a plurality of storage modules is changed, so that the control device cannot support a plurality of connection modes.

Therefore, an object is to provide a storage system and an output controller in which a control device may detect the connection mode of a plurality of storage modules and control the plurality of storage modules by the control contents corresponding to the detected connection mode.

Solution to Problems

In order to solve the above-described problem, a storage system disclosed in the present application is a storage system including a plurality of storage units configured to be separated from each other and connected to each other in series and/or in parallel, and an output controller, to which information of a total output voltage of a plurality of storage units is supplied, connected to a plurality of storage units through a communication path, wherein the output controller receives information of individual output voltages of the storage units as a result of communication through the communication path and the output controller determines a connection mode of the storage units from the information of the total output voltage and the information of the individual output voltages of the storage units.

An output controller disclosed in the present application is connected to a plurality of storage units configured to be separated from each other and connected to each other in series and/or in parallel, information of a total output voltage of the plurality of storage units being supplied to the output controller, wherein the output controller is connected to the plurality of storage units through a communication path, information of individual output voltages of the storage units being input to the output controller as a result of communication through the communication path, and the output controller determines a connection mode of the storage units from the information of the total output voltage and the information of the individual output voltages of the storage units.

Preferably, when the number of the storage units is set to N, the total output voltage is set to V(Total), the individual output voltages are set to $V(1), V(2), \ldots,$ and $V(N)$, and the number of parallels of the connection mode is set to M, the output controller determines whether a determination equation is satisfied, and determines (N/M) parallel M series when the determination equation is satisfied.

Determination Equation:

$$V(1)=V(2)=\ldots=V(N)=(1/M)\times V(\text{Total})$$

Effects of the Invention

According to the disclosure of the present application, the output controller may detect the connection mode and perform a controlling process corresponding to the detected connection mode when a plurality of storage units is connected in series and/or in parallel. Therefore, versatility of the output controller or the storage unit may be improved. Further, it is possible to determine an error in connection of a plurality of storage units, thereby improving safety of the storage system.

Additional features and advantages are described herein, and will be apparent from the following Detailed Description and the figures.

DETAILED DESCRIPTION

Although an embodiment described hereinafter is a preferred specific example of the present invention with technically preferred various limitations, the scope of the present invention is not limited to the embodiment unless it is especially described to limit the invention in the following description.

Example of Storage Module

In a case where a great number of storage devices such as battery cells are used for generating significant power, a configuration in which a plurality of storage units (hereinafter, referred to as storage modules) is connected to each other and a control device common to the plurality of storage modules is provided is adopted. Such configuration is referred to as a battery system.

The storage module is a unit obtained by combining a plurality of battery cells and a controller.

Figure 1:
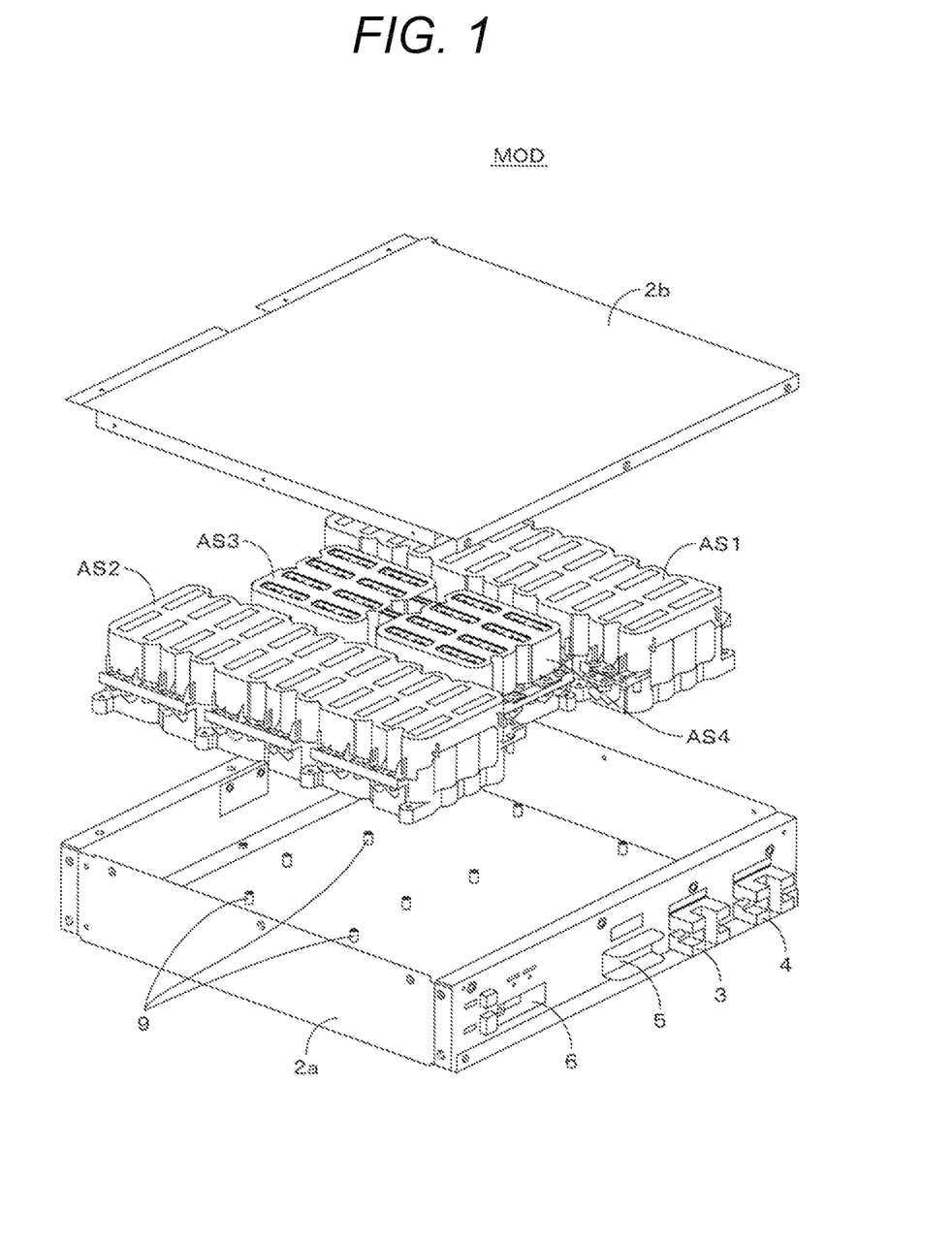
FIG. 1 is an exploded perspective view of an example of a storage module.

FIG. 1 is a perspective view of an entire configuration of a storage module MOD. An exterior case of the storage module MOD is formed of an exterior lower case 2a and an exterior upper case 2b made of metal to which sheet-metal processing is applied. A material having high thermal conductivity and radiation factor is preferably used as a material of the exterior lower case 2a and the exterior upper case 2b. Excellent casing radiation performance may be obtained and increase in temperature inside the case may be inhibited. Due to the excellent casing radiation performance, an opening of the case may be minimized or removed and high dust-resistance and drip-resistance may be realized. For example, the material of the exterior lower case 2a and the exterior upper case 2b is aluminum, an aluminum alloy, copper, or a copper alloy. For example, a thickness of the exterior lower case 2a and the exterior upper case 2b is set to approximately 1 mm or larger.

An external positive terminal 3 and an external negative terminal 4 for charge and discharge to and from the storage module MOD are provided on a rear surface of the case. Short preventing walls 3a for preventing shorts between the terminals are provided on both sides of the external positive terminal 3. Short preventing walls 4a for preventing the shorts between the terminals are provided on both sides of the external negative terminal 4.

Further, a current breaker 5 is provided on a rear surface of the storage module MOD. It is possible to improve safety of a battery unit by providing the current breaker 5. A malfunction preventing part 5a is provided around the current breaker 5. Further, a connector unit 6 for communication with a control circuit provided in a case 2 is provided. The control circuit is provided for monitoring the temperature of the battery unit and controlling charge, discharge and the like. Further, a display device such as an LED for displaying an operating state is provided on a front surface of the case.

The exterior lower case 2a of the case has a box-like configuration and the exterior upper case 2b is provided so as to cover an opening thereof. Submodules AS1 to AS4 are stored in a storage space of the exterior lower case 2a. A plurality of bosses 9 is formed on a bottom surface of the exterior lower case 2a for fixing the submodules AS1 to AS4 by means of a screw and the like. The submodules AS1 to AS4 are assembled in advance outside the case.

Each submodule is obtained by integrating a plurality of battery blocks by using an insulating case as a sub storage case. A molded part made of plastic or the like may be used as the case of the submodule. The submodules AS1 to AS4 are configured to store a plurality of battery blocks in the case such that a positive terminal and a negative terminal of an inner battery block are not exposed.

One battery block is obtained by connecting eight cylindrical lithium-ion secondary batteries in parallel, for example. Each of the submodules AS1 and AS2 is obtained by integrating six battery blocks by using an upper case and a lower case. Each of the submodules AS3 and AS4 is obtained by integrating two battery blocks by using the upper case and the lower case. Therefore, a total of (6+6+2+2=16) battery blocks are used. The battery blocks are connected in series, for example.

<Connection Between Battery Blocks>

A metal plate for connection such as a bus bar is used for connecting the battery blocks in series in each of the submodules AS1 to AS4. The bus bar is made of elongated bar-like metal. A plurality of holes is formed on the bus bar for connecting the same to a connecting metal plate and the like derived from the battery block.

Figure 2:
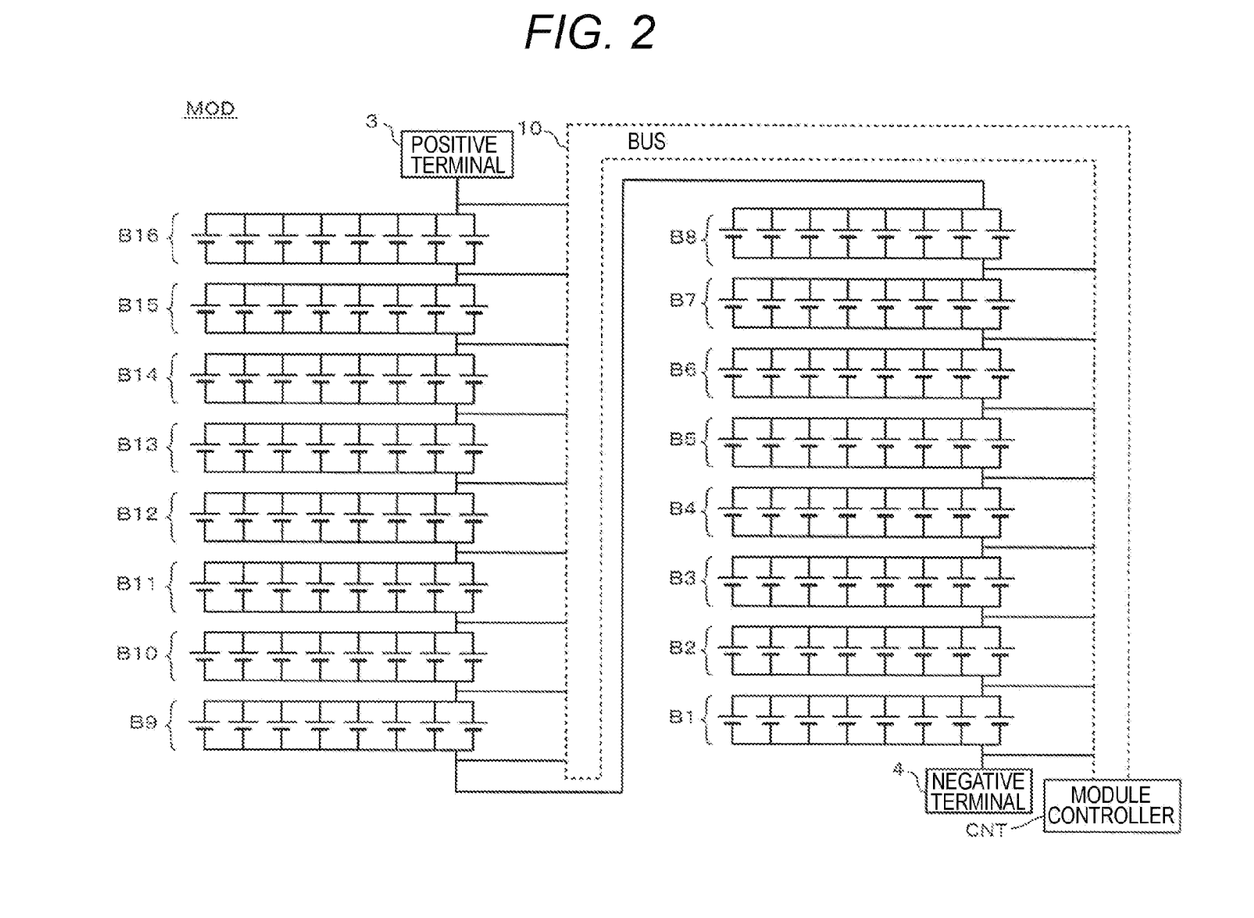
FIG. 2 is a connection diagram illustrating a connection configuration of an example of the storage module.

As illustrated in FIG. 2, battery blocks B1 to B16 (appropriately referred to as battery blocks B when it is not required to distinguish the battery blocks from each other), each of which is obtained by connecting eight batteries in parallel, are connected in series. Each of the battery blocks B1 to B16 is connected to a control device of each storage module (hereinafter, appropriately referred to as a module controller) CNT and the charge and discharge thereof are controlled. The charge and discharge are performed through the external positive terminal 3 and the external negative terminal 4. For example, the battery blocks B1 to B6 are included in the submodule AS1 and the battery blocks B11 to B16 are included in the submodule AS2. Further, the battery blocks B7 and B10 are included in the submodule AS3 and the battery blocks B8 and B9 are included in the submodule AS4.

Information of a voltage between the positive and negative electrodes of each battery block and the like is supplied to the module controller CNT through a bus 10. The module controller CNT monitors the voltage, the current, and the temperature of each battery block and outputs a monitored result as information of an inner state. For example, one storage module MOD outputs (16×3.5 V=56 V).

<Storage System>

Figure 3:
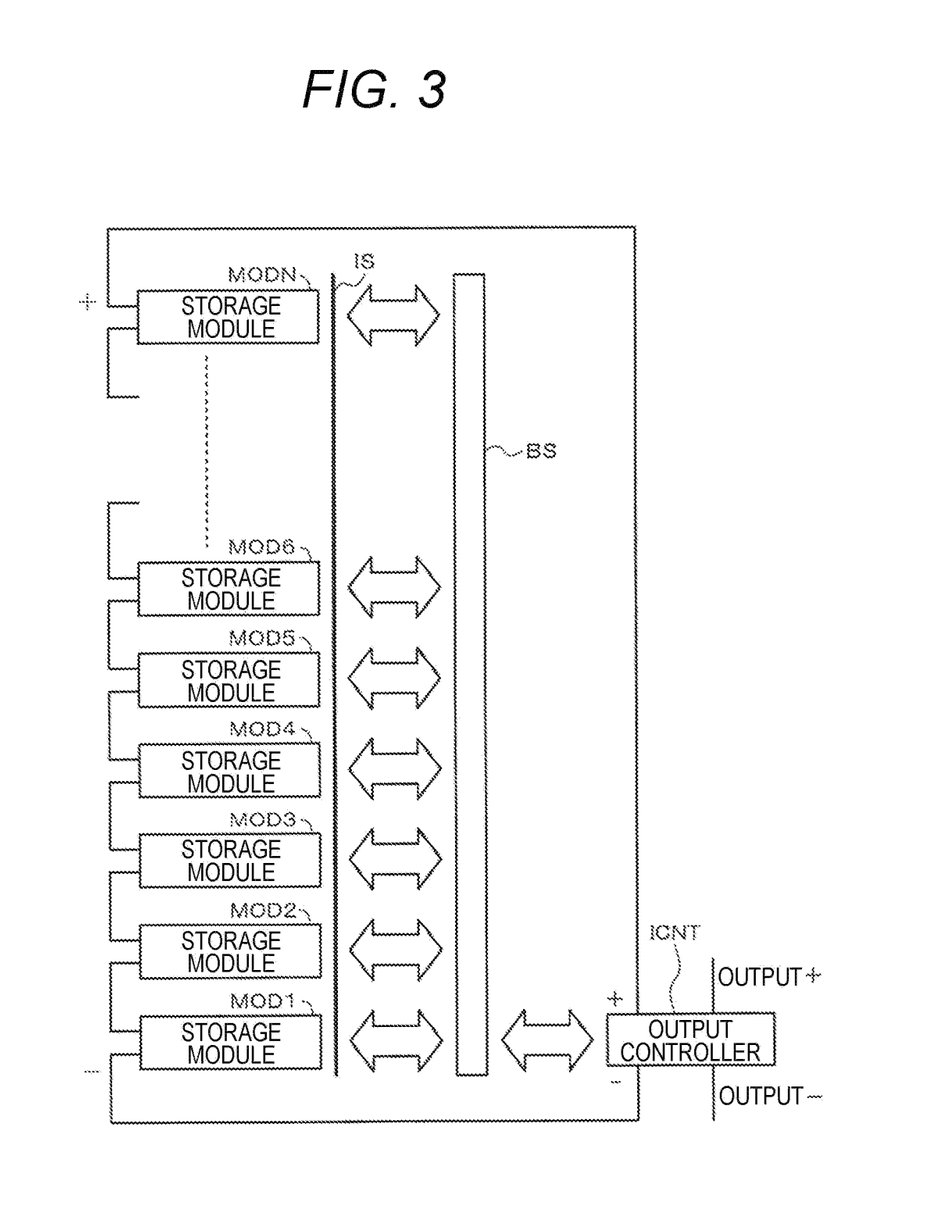
FIG. 3 is a block diagram of an example of a storage system.

Further, N storage modules MOD1 to MODN are connected in series as illustrated in FIG. 3. The storage modules MOD1 to MODN are connected to an interface bus BS through an insulating unit IS. An insulating interface IF is provided on each storage module MOD for connecting the module controller CNT to an external interface bus BS. The insulating interface IF serves to insulate the storage module MOD from the interface bus BS. Further, each module controller is connected to a control device of all (hereinafter, appropriately referred to as an output controller) ICNT and the output controller ICNT performs management of the charge and discharge and management to inhibit deterioration and the like.

A serial interface is used as the bus 10 in the storage module and the bus BS for connecting the storage modules MOD1 to MODN and the output controller ICNT. An SM bus (System Management Bus) and the like is specifically used as the serial interface. For example, an I2C bus may be used. The I2C bus is a synchronous serial communication for communicating by using two signal lines, which are an SCL (serial clock) and a bidirectional SDA (serial data).

The controller CNT of each storage module MOD and the output controller ICNT communicate with each other. That is, the output controller ICNT receives the information of the inner state of each storage module and a charging process and a discharging process of each storage module are managed. The output controller ICNT supplies an output of a series connection of the N storage modules (N×56 V) to a load. In an example of N=14, the output is (14×56 V=784 V).

Figure 4:
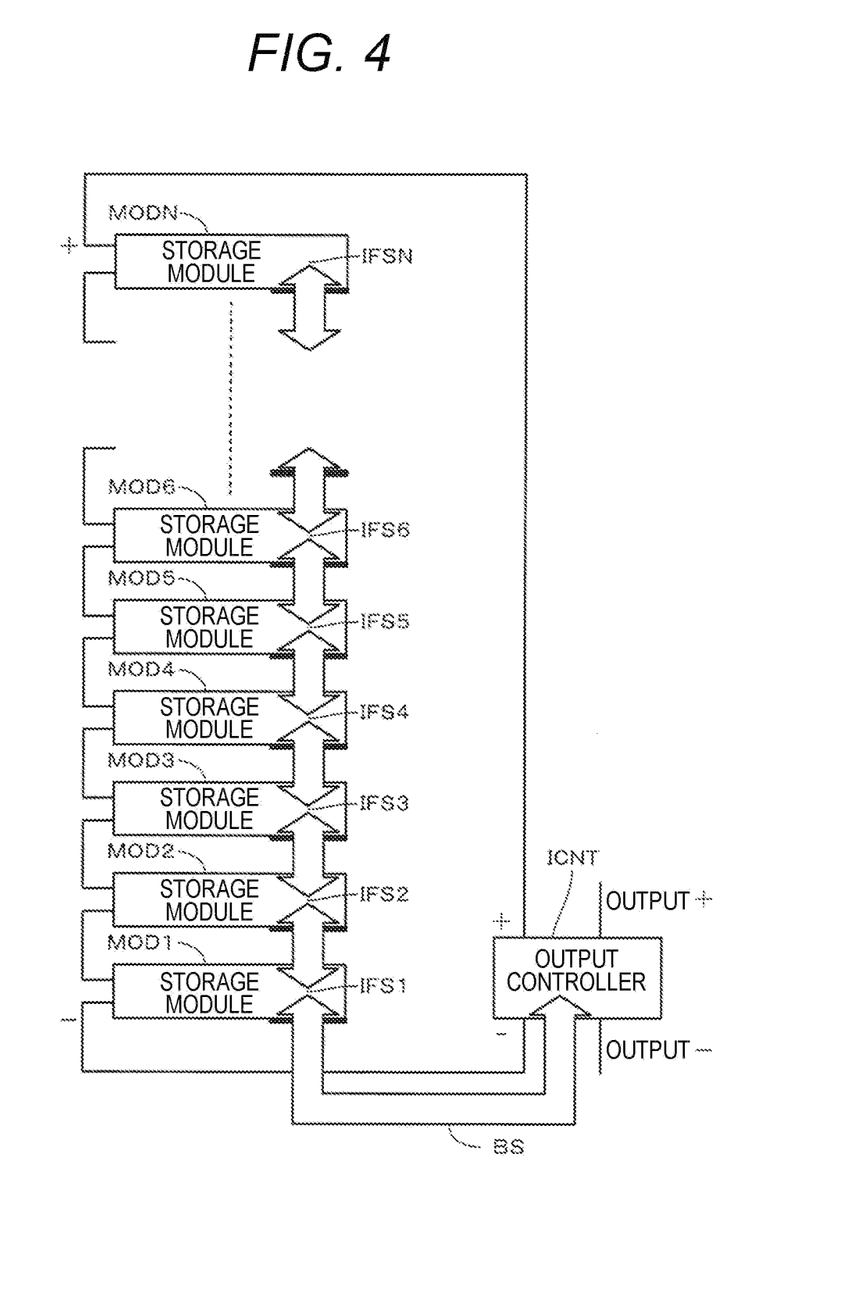
FIG. 4 is a block diagram of another example of the storage system.

FIG. 4 illustrates another example of the storage system. In another example, the N storage modules MOD1 to MODN are connected in series. Each of the storage modules MOD1 to MODN includes an insulating interface for insulating the storage modules from each other. The module controller of each storage module communicates with an upper or lower storage module or with an external output controller through photo couplers IFS1 to IFSN as the insulating interfaces.

The output controller ICNT is connected to the lowest storage module MOD1. The output controller ICNT controls an entire battery system. The output controller ICNT receives the information of the inner state of each storage module and supplies and blocks a charging current and a discharging current to and from each storage module, thereby controlling the charge and discharge of each storage module. The output of the series connection of the N storage modules (N×56V) is supplied to the load. In the example of N=14, the output is (14×56 V=784 V).

<Storage System>

Figure 5:
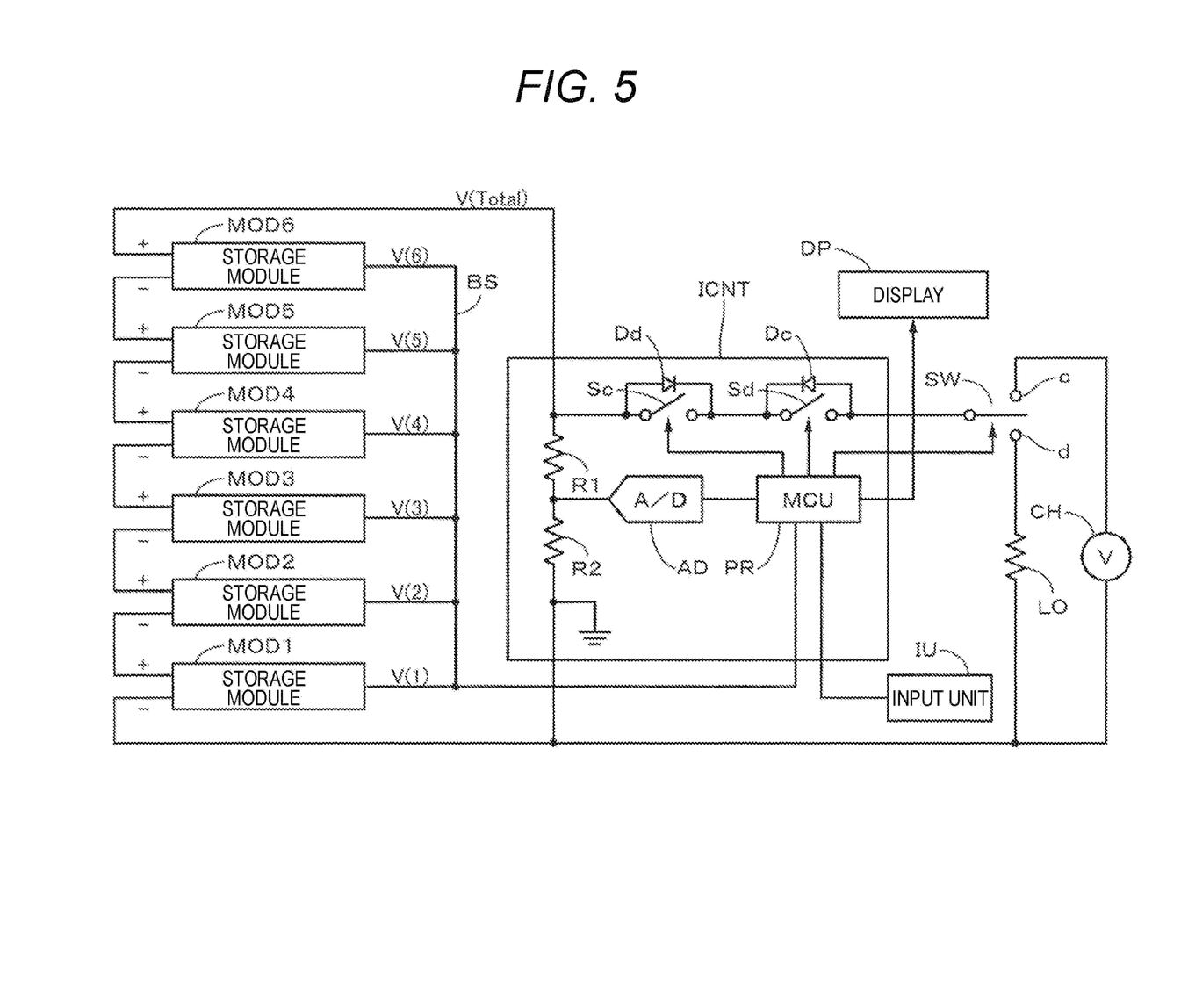
FIG. 5 is a block diagram illustrating the storage system having a configuration in which a plurality of storage modules is connected in series.
Figure 6:
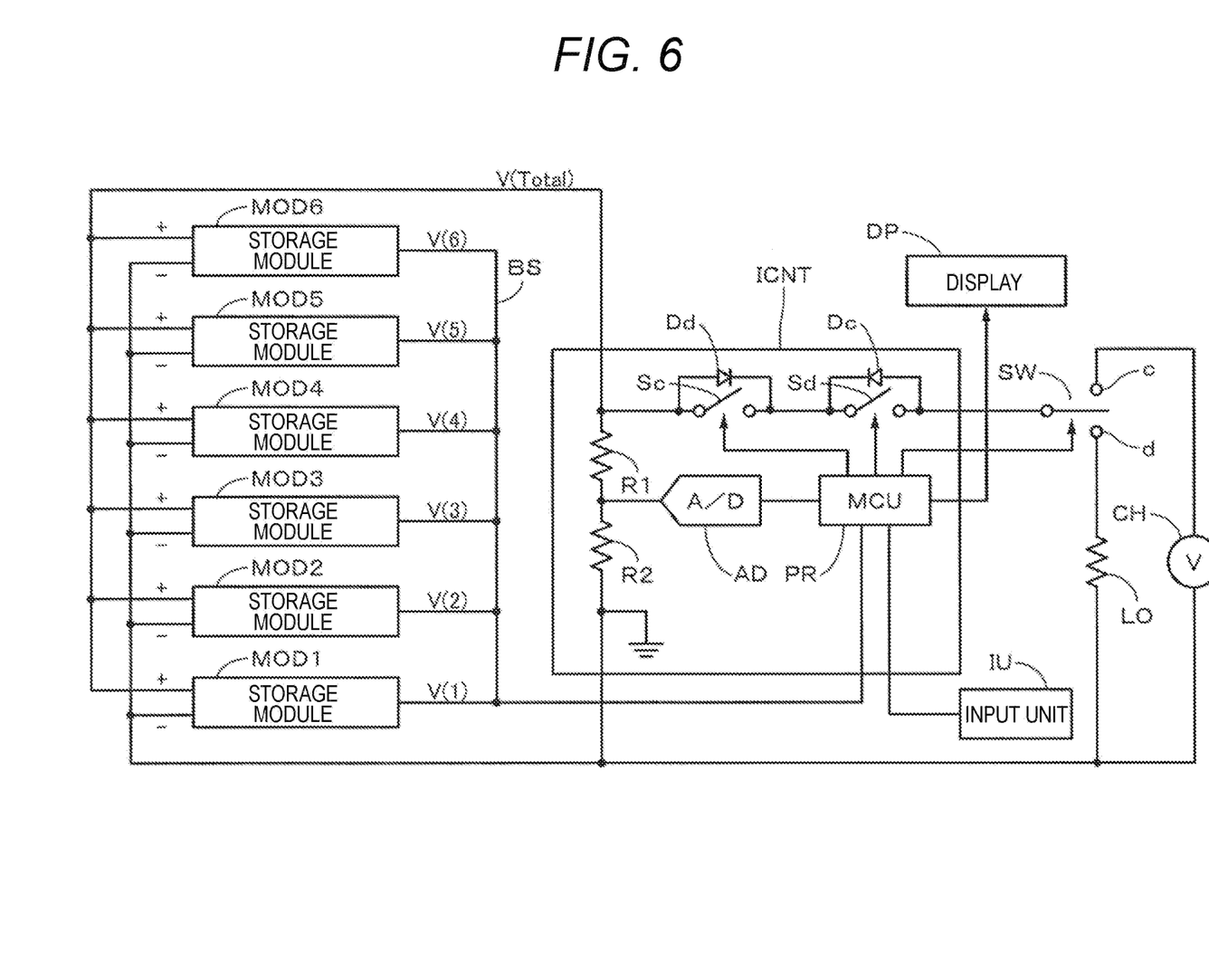
FIG. 6 is a block diagram illustrating the storage system having a configuration in which a plurality of storage modules is connected in parallel.
Figure 7:
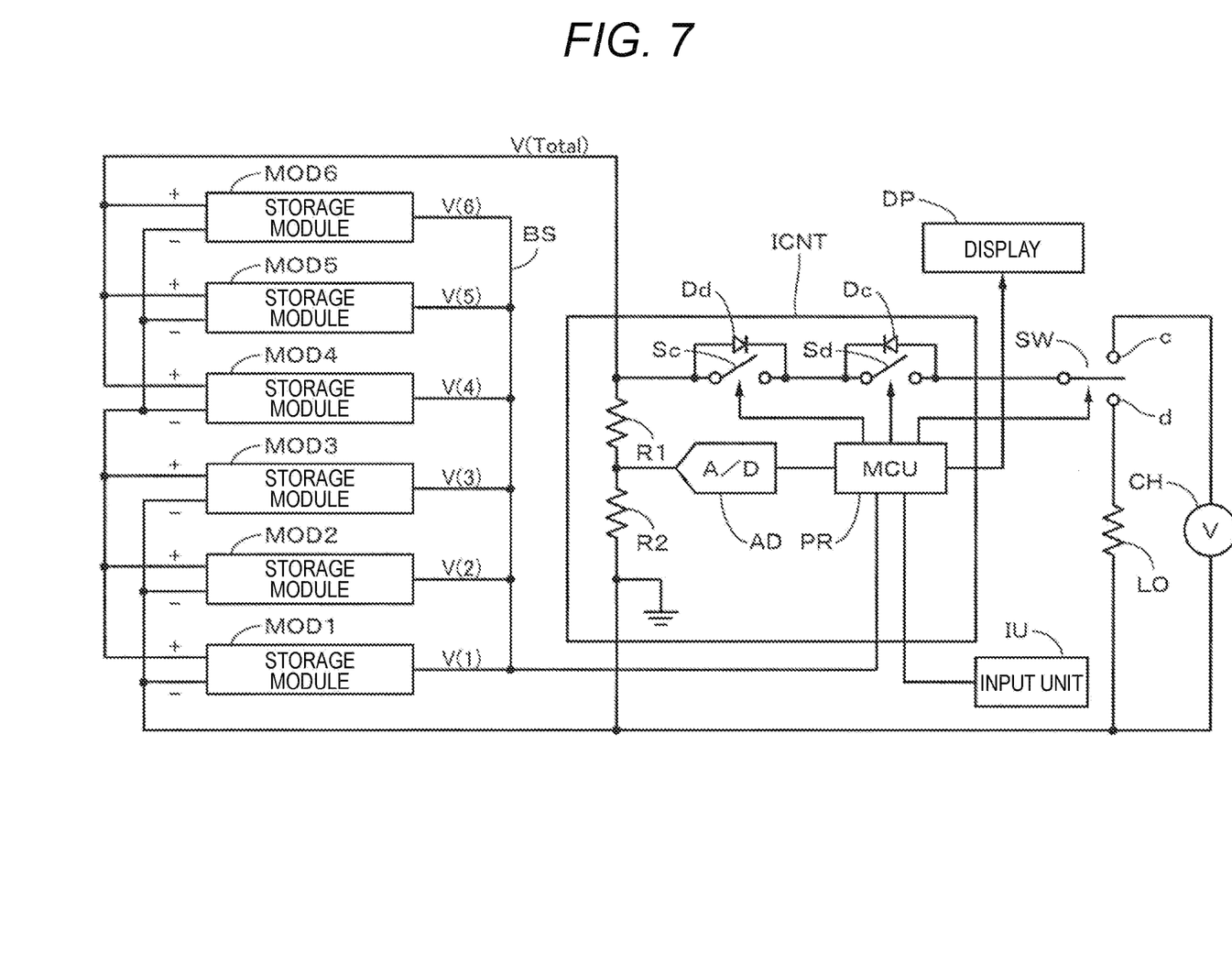
FIG. 7 is a block diagram illustrating the storage system having a configuration in which a plurality of storage modules is connected in 3 parallel 2 series.

An example of the storage system capable of detecting a connection mode of a plurality of storage modules is hereinafter described. The N storage modules, for example, six storage modules MOD1 to MOD6, each of which has the above-described configuration to generate the same output, are used. FIGS. 5, 6, and 7 illustrate examples in which the storage modules MOD1 to MOD6 are connected in different connection modes.

That is, FIG. 5 illustrates the example in which all the storage modules MOD1 to MOD6 are connected in series, FIG. 6 illustrates the example in which all the storage modules MOD1 to MOD6 are connected in parallel, and FIG. 7 illustrates the example in which the storage modules MOD1, MOD2, and MOD3 are connected in parallel, the storage modules MOD4, MOD5, and MOD6 are connected in parallel, and the two parallel connections are connected in series. The connection mode in FIG. 7 is an example of (M=2, N=6) in general expression of (N/M) parallel M series. A case of (M=1) means that all the N modules are connected in parallel. Different connection modes may be realized by connecting the external positive terminal 3 and the external negative terminal 4 of each storage module (refer to FIG. 1) by well-known connecting means such as a power connecting cable and a connecting tab. Further, the number of the storage modules to be used may be arbitrarily set according to application and the like.

The common output controller ICNT is connected to a plurality of storage modules MOD1 to MOD6. Output voltages (appropriately referred to as individual output voltages) of the storage modules MOD1 to MOD6 are expressed as V(1) to V(6), respectively, and a voltage generated between the positive terminal and the negative terminal regarding an entire connection configuration of the storage modules MOD1 to MOD6 is expressed as a total output voltage V(Total). The total output voltage V(Total) and the individual output voltages V(1) to V(6) of respective modules are supplied to the output controller ICNT.

The output controller ICNT includes a controller PR. The controller PR is a microcomputer including a CPU (Central Processing Unit) and the like, for example. In the controller PR, a ROM (Read Only Memory), a RAM (Random Access Memory) and the like are connected to the CPU. The controller PR generally manages the storage modules MOD1 to MOD6 by executing a program stored in the ROM.

The individual output voltages V(1) to V(6) of the modules are supplied from the module controllers of the modules to the controller PR of the output controller ICNT through the bus BS. Although not illustrated, the information regarding the current and the temperature also is supplied from the module controller of each module to the controller PR of the output controller ICNT through the bus BS. The controller PR controls a display DP and a combined total voltage value and the like is displayed on the display DP. The display DP is a liquid crystal display device, for example. Further, an input unit IU is connected to the controller PR. An instruction of a user is input to the controller PR through the input unit IU.

The positive terminal and the negative terminal, which are output terminals of all the storage modules MOD1 and MOD6, are connected to the controller ICNT and the charge and discharge of the storage modules MOD1 to MOD6 are managed through the output controller ICNT. The positive terminal of the storage modules MOD1 to MOD6 is connected to a terminal of a switch circuit SW through switch circuits Sc and Sd of the output controller ICNT. The switch circuits Sc and Sd are connected in series. A diode Dd is connected in a direction in which the discharging current is applied so as to be in parallel with the switch circuit Sc and a diode Dc is connected in a direction in which the charging current is applied so as to be in parallel with the switch circuit Sd.

A charging device CH is connected to one terminal c of the switch circuit SW and a load LO is connected to the other terminal d of the switch circuit SW. The charging device CH is an in-vehicle charger, a charger connected through an external charging connector and the like. The chargers are configured to rectify a household AC power supply, for example, by a rectifier circuit and supply a rectified output to the battery of the storage module through a DC-DC converter. Further, there is also a case where they are charged by power generated by photovoltaic power generation, wind-power generation and the like. The load LO is a driving motor of a vehicle, a bike and the like, household electric equipment and the like, for example. The power is supplied to the load LO through a DC-AC inverter as needed.

The switch circuit SW is controlled by a control signal from the controller PR. The terminal c of the switch circuit SW is selected at the time of the charge. The switch circuit Sc is turned on and the switch circuit Sd is turned off by the control signal from the controller PR. The charging current from the charging device CH is supplied to the storage modules MOD1 to MOD6 through the diode Dc and the switch circuit Sc.

The terminal d of the switch circuit SW is selected at the time of the discharge. The switch circuit Sc is turned off and the switch circuit Sd is turned on by the control signal from the controller PR. The discharging current from the battery system is supplied to the load LO through the diode Dd and the switch circuit Sd. A MOSFET (Metal Oxide Semiconductor Field Effect Transistor), for example, may be used as the switch circuits Sc and Sd. A parasitic diode of the MOSFET serves as the diodes Dc and Dd.

The total output voltage V(Total) of the storage modules MOD1 to MOD6 is divided by resistors R1 and R2 in the output controller ICNT. A voltage extracted from a connecting point of the resistors R1 and R2 is supplied to an A/D converter AD to be converted to a digital value. A digital signal from the A/D converter AD is supplied to the controller PR. The controller PR determines (detects) the connection mode of the storage modules MOD1 to MOD6 by using the total output voltage converted to the digital value and the individual voltages V(1) to V(6) of the respective modules supplied through the bus BS.

<Process of Determining Connection Mode>

Figure 8:
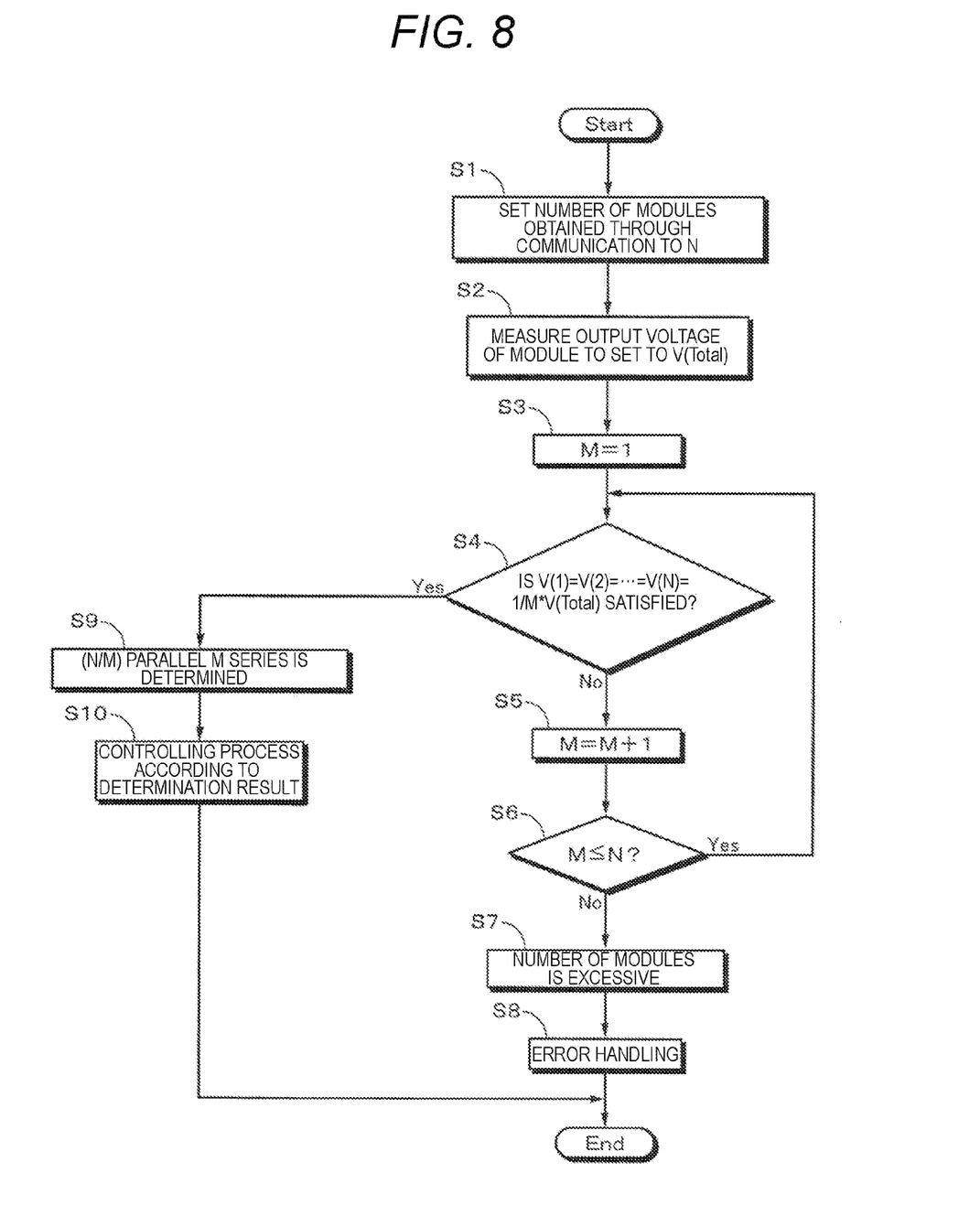
FIG. 8 is a flowchart for illustrating an example of operation of the storage system.

A process of determining the connection mode is described with reference to a flowchart in FIG. 8. The process illustrated in the flowchart is performed by the controller PR of the output controller ICNT. Meanwhile, in the processes in FIG. 8 and in FIG. 9 to be illustrated later, the number of the storage modules to be used is set to N (=1, 2, . . . , N). The process starts and at first step S1, the number N of the storage modules becomes clear as a result of the communication with the storage modules MOD1 to MOD6.

At step S2, the total output voltage V(Total) of all the batteries is measured. As described above, an output of the A/D converter AD is set to V(Total). The A/D converter AD amplifies an input voltage so as to cancel a voltage division ratio of the resistors R1 and R2. For example, when the voltage division ratio is 1/2, the A/D converter AD doubles the input voltage. Meanwhile, the output of the A/D converter AD need not be amplified. In this case, the output voltage of each storage module used in the determining process is multiplied by a coefficient corresponding to the voltage division ratio of the resistors. Further, it is also possible to supply the total output voltage V(Total) to the controller PR by a configuration other than resistor voltage division.

A variable (number of series) M is set to 1 at step S3. The determining process is performed at step S4. The determining process is represented by the following equation.

$$V(1)=V(2)= \ldots =V(N)=(1/M) \times V(\text{Total})$$

That is, it is determined whether the equation is satisfied. When the equation is not satisfied, the process shifts to step S5 and when the equation is satisfied, the process shifts to step S9. Meanwhile, in the above-described equation, a difference in an allowable range is regarded as a detection error and it is regarded that equality is satisfied.

When a determination result at step S4 is negative, a value of M is incremented by 1 at step S5 and the determining process of (M≤N?) is performed at step S6. When the determination result at step S6 is positive, the process returns to step S4 and the similar process is repeated. When the result at step S6 is negative, that is, when (M>N) is determined, it is determined that the number of the modules is excessive at step S7 and error handling is performed at step S8. Then, the process ends. For example, at step S8, the switch circuits Sc and Sd are turned off to block the output, and an error message is displayed on the display DP. The output may be blocked at the time of erroneous connection by the error handling, so that the safety of the system may be improved.

When the determination result at step S4 is positive, (N/M) parallel M series is determined at step S9. Then, a controlling process is performed according to the determination result at step S10. Then, the process ends.

In an all-series configuration illustrated in FIG. 5, V(Total)=V(1)+V(2)+ . . . +V(N) is satisfied. Therefore, the determination result at step S4 is positive when M=6 is satisfied. In this case, the determination result at step S9 is (6/6=1) parallel 6 series. Then, at step S10, the controlling process in a case of the all-series is performed.

In an all-parallel configuration illustrated in FIG. 6, V(1)=V(2)= . . . =V(N)=V(Total) is satisfied. Therefore, the determination result at step S4 is positive when M=1 is satisfied. In this case, the determination result at step S9 is (6/1=6) parallel 1 series. Then, at step S10, the controlling process in a case of the all-parallel is performed.

In a 3 parallel 2 series configuration illustrated in FIG. 7, V(1)=V(2)= . . . =V(N)=(½)×V(Total) is satisfied. Therefore, the determination result at step S4 is positive when M=2 is satisfied. In this case, the determination result at step S9 is (6/2=3) parallel 2 series. Then, at step S10, the controlling process in a case of 3 parallel 2 series is performed.

<Example of Process According to Determination Result>

Figure 9:
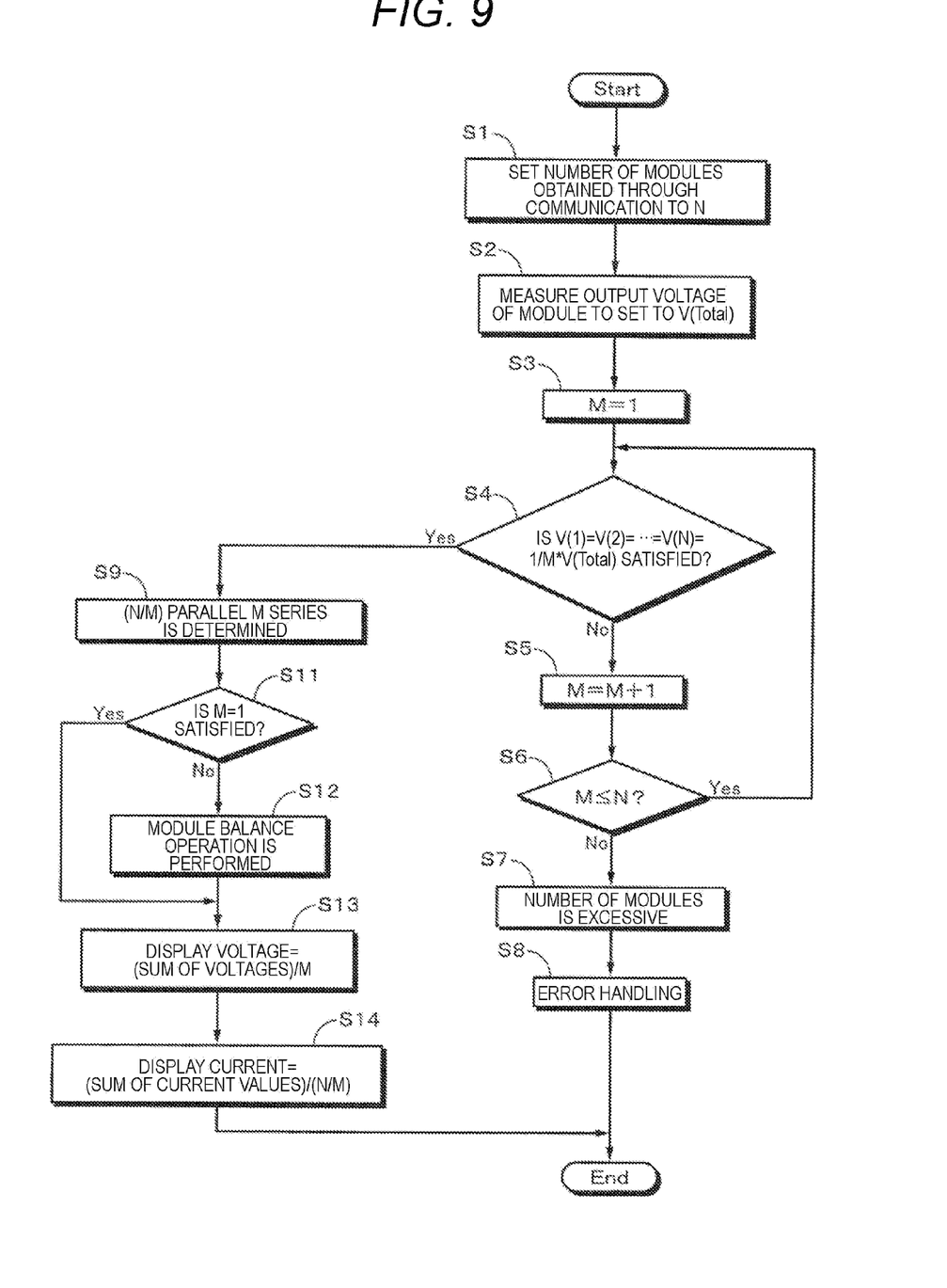
FIG. 9 is a flowchart for illustrating a more specific example of the operation of the storage system.

An example of the process according to the determination result described as step S10 is illustrated in FIG. 9. When (N/M) parallel M series is determined at step S9, it is determined whether M=1 is satisfied at step S11. As described above, M=1 means that the connection mode is the all-parallel.

When the determination result at step S11 is negative, that is, when it is not the all-parallel, balance operation is performed such that the output voltages of the storage modules connected in series are the same at step S12. In the case of (N/M) parallel M series, the balance operation is performed such that the output voltages of the storage modules connected in series (N parallels) are the same. The balance operation is a process to determine that it is not well-balanced when difference in the individual output voltage between the modules is not smaller than a threshold, for example, and discharge only the module of which individual output voltage is excessive, for example, to make the individual output voltages of them substantially the same. The balance operation is performed for inhibiting the deterioration in the storage module. When the determination result at step S11 is positive, that is, in the case of the all-parallel, the balance operation at step S12 is not performed.

When the determination result at step S11 is positive, and after the balance operation at step S12, a voltage value of the output voltage at present is displayed on the display DP at step S13. That is, the voltage value of a result of V(Total)/M is displayed. Further, a current value of an output current at present is displayed on the display DP at step S14. That is, the current value of a result of I(Total)/(N/M) is displayed. Then, the process ends. Meanwhile, it is preferable that the display of the voltage value at step S13 be performed in the case of the series connection and the display of the current value at step S14 be performed in the case of the parallel connection. That is, as the result of the determination at step S11, when (M=1) is satisfied, the current value is displayed and when (M=1) is not satisfied, the voltage value is displayed.

<Application>

An application is described with reference to FIG. 10. For example, n storage devices, each of which is obtained by connecting all six storage modules in series, for example, are used and output controllers ICNT1 to ICNTn of respective storage devices and an integrated output controller ICNTnn are connected to each other by a bus BSnn. The charging device CH and the load LO are connected to the integrated output controller ICNTnn through the switch circuit SW.

Figure 10:
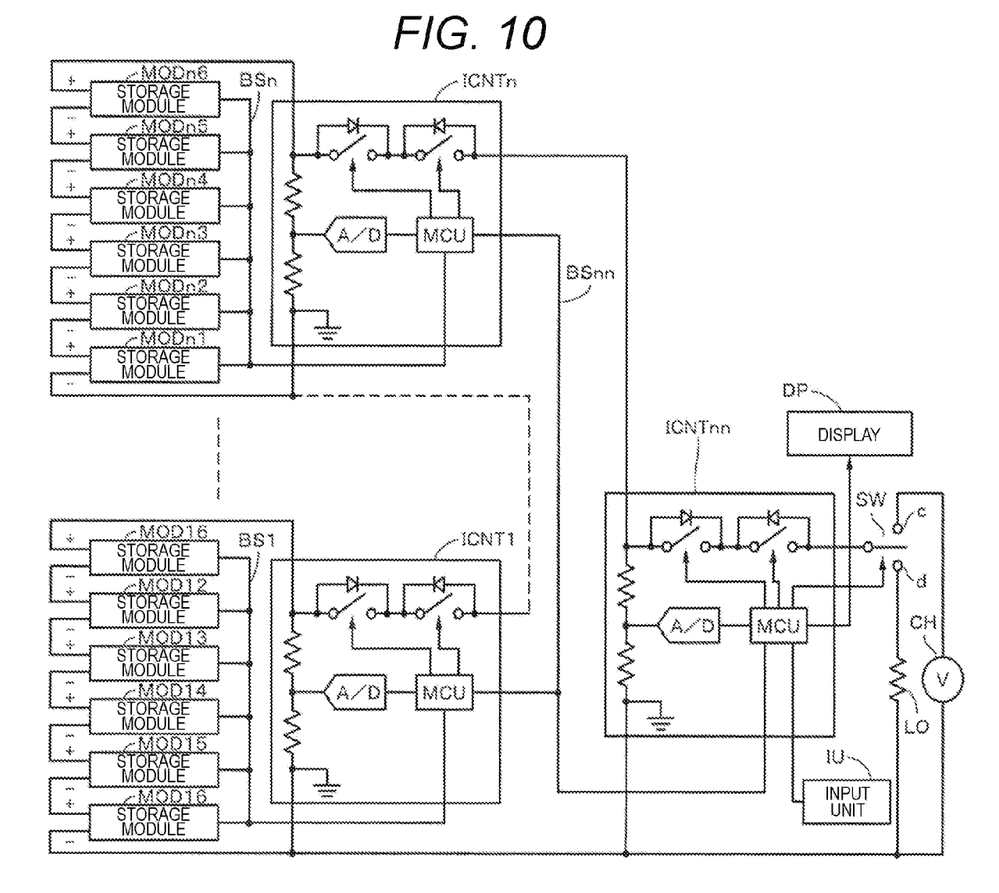
FIG. 10 is a block diagram illustrating an application of the storage system.

The configuration illustrated in FIG. 10 operates as the above-described storage system. That is, information of a detection result regarding the connection mode of the storage devices is supplied from the controllers ICNT1 to ICNTn to the integrated output controller ICNTnn. Each storage device is managed by the integrated output controller ICNTnn according to the detection result regarding the connection mode of the storage devices. Further, the integrated output controller ICNTnn may control the switch circuit of the output controllers ICNT1 to ICNTn, thereby appropriately switching the number of the storage devices to be used.

Modification

The lithium-ion secondary battery is used as the storage device in the description above. However, it is also possible to use a secondary battery other than the lithium-ion secondary battery. Further, it is also possible to use a storage device other than the secondary battery, such as an electric double layer capacitor.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

MOD, MOD1 to MODN . . . storage module, ICNT . . . output controller, CNT . . . controller of each storage module, ICNT . . . output controller, PR . . . controller, DP . . . display, CH . . . charging device, LO . . . load

The invention claimed is:

1. A storage system, comprising:
a plurality of storage units separated from each other and connected to each other in series and/or in parallel; and
an output controller programmed to:
receive information of a total output voltage of the plurality of storage units, wherein the output controller is connected to the plurality of storage units through a communication path;
receive information of individual output voltages of each of the plurality of storage units as a result of communication through the communication path;
where a number of the plurality of storage units is set to N, the total output voltage is set to V(Total), the individual output voltages are set to V(1), V(2), . . . , and V(N), and a number of series connections of a connection mode is set to M, determine whether a determination equation is satisfied;
determine the connection mode as (N/M) parallel M series in an event the determination equation is satisfied, wherein the determination equation is represented by:

$$V(1)=V(2)= \ldots =V(N)=(1/M) \times V(\text{Total}); \text{ and}$$

execute a balance operation on the plurality of storage units based on the determined connection mode of the plurality of storage units.

2. The storage system according to claim 1, wherein the output controller is further programmed to control the plurality of storage units based on the determined connection mode of the plurality of storage units.

3. The storage system according to claim 1, wherein each of the plurality of storage units includes a plurality of storage devices in a storage case, and
an external electrode terminal connected to an electrode terminal of each of the plurality of the storage devices and a communication terminal connected to a storage unit controller to manage the plurality of storage devices are provided on the storage case.

4. The storage system according to claim 1, wherein the output controller is further programmed to display at least one of (sum of voltage values)/M and (sum of current values)/(N/M) on a display device.

5. The storage system according to claim 1, wherein the output controller is further programmed to:
set a value of M to 1 and determine whether the determination equation is satisfied while the value of M is sequentially incremented by 1 until (M=N) is satisfied in an event the determination equation unsatisfied, and
execute error handling in an event (M>N) is satisfied.

6. The storage system according to claim 2, wherein based on a determination of a series connection in the connection mode of the plurality of storage units, the output controller is further programmed to control the plurality of storage units so as to make output voltages in the series connection substantially the same based on the balance operation.

7. The storage system according to claim 1, wherein each of the plurality of storage units is configured to communicate with one or more storage units among the plurality of storage units through photo couplers.

8. The storage system according to claim 1, wherein the output controller is further programmed to display a current value in an event M=1 is satisfied, and display a voltage value in an event M≠1.

9. The storage system according to claim 1, wherein the output controller is programmed to execute the balance operation to determine whether a difference in the individual output voltages between the plurality of storage units is greater than a threshold, and to make the individual output voltages the same.

10. The storage system according to claim 9, wherein the output controller is further programmed to cause one or more of the plurality of storage units to be discharged so as to make the individual output voltages of the plurality of storage units same.

11. An output controller connected to a plurality of storage units separated from each other and connected to each other in series and/or in parallel, wherein information of a total output voltage of the plurality of storage units is configured to be supplied to the output controller, wherein the output controller is connected to the plurality of storage units through a communication path, information of individual output voltages of the plurality of storage units is configured to be input to the output controller as a result of communication through the communication path, and the output controller is programmed to:

determine whether a determination equation is satisfied, wherein a number of the plurality of storage units is set to N, the total output voltage is set to V(Total), the individual output voltages are set to $V(1), V(2), \ldots,$ and $V(N)$, and a number of series connections of a connection mode is set to M; and determine the connection mode as (N/M) parallel M series in an event the determination equation is satisfied, wherein the determination equation is represented by:

$V(1)=V(2)= \ldots =V(N)=(1/M) \times V(\text{Total})$; and execute a balance operation on the plurality of storage units based on the determined connection mode of the plurality of storage units.

12. The output controller according to claim 11, wherein the output controller is further programmed to control the plurality of storage units based on the determined connection mode of the plurality of storage units.

13. The output controller according to claim 11, wherein the output controller is further programmed to display a voltage value of (V(Total)/M) on a display device.

14. A storage system, comprising:

a plurality of storage units separated from each other and connected to each other in series and/or in parallel; and an output controller programmed to:

receive information of a total output voltage of the plurality of storage units, wherein the output controller is connected to the plurality of storage units through a communication path;

receive information of individual output voltages of the plurality of storage units as a result of communication through the communication path;

determine whether a determination equation is satisfied, wherein a number of the plurality of storage units is set to N, the total output voltage is set to V(Total), the individual output voltages are set to $V(1), V(2), \ldots,$ and $V(N)$, and a number of series connections of a connection mode is set to M; and determine the connection mode as (N/M) parallel M series in an event the determination equation is satisfied, wherein the determination equation is represented by:

$V(1)=V(2)= \ldots =V(N)=(1/M) \times V(\text{Total})$; and control a charge or discharge of one or more of the plurality of storage units based on the determined connection mode of the plurality of storage units.

* * * * *